United States Patent
Ahmad et al.

(10) Patent No.: US 7,604,491 B1
(45) Date of Patent: Oct. 20, 2009

(54) TECHNIQUES FOR PROVIDING ELECTRICAL AND THERMAL CONDUCTIVITY BETWEEN ELECTRICAL COMPONENTS AND PRINTED CIRCUIT BOARDS USING SLEEVES DEFINING SUBSTANTIALLY CONICAL SHAPES

(75) Inventors: Mudasir Ahmad, Santa Clara, CA (US); David Popovich, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/107,334

(22) Filed: Apr. 22, 2008

(51) Int. Cl.
*H01R 12/00* (2006.01)
(52) U.S. Cl. ...................................................... 439/82
(58) Field of Classification Search .................. 439/81, 439/82, 78, 733.1, 751–752.5, 66; 174/261; 361/760
See application file for complete search history.

(56) References Cited

U.S. PATENT DOCUMENTS

| | | | | |
|---|---|---|---|---|
| 2,877,441 A | * | 3/1959 | Narozny | 439/857 |
| 3,654,583 A | * | 4/1972 | Mancini | 439/82 |
| 4,036,549 A | * | 7/1977 | Honda et al. | 439/722 |
| 5,154,621 A | * | 10/1992 | Legrady | 439/82 |
| 5,509,814 A | * | 4/1996 | Mosquera | 439/82 |
| 6,148,398 A | | 11/2000 | Chang et al. | |
| 6,483,041 B1 | | 11/2002 | Downes | |
| 6,552,277 B1 | | 4/2003 | Downes | |
| 6,728,104 B1 | | 4/2004 | Ahmad et al. | |
| 6,773,269 B1 | | 8/2004 | Downes | |
| 6,800,545 B2 | | 10/2004 | Downes | |
| 7,019,976 B1 | | 3/2006 | Ahmad et al. | |
| 7,150,653 B1 | | 12/2006 | Mason | |
| 7,473,111 B2 | * | 1/2009 | Konishi | 439/82 |
| 2002/0094708 A1 | * | 7/2002 | Budman et al. | 439/82 |

* cited by examiner

*Primary Examiner*—Edwin A. Leon
*Assistant Examiner*—Vanessa Girardi
(74) *Attorney, Agent, or Firm*—BainwoodHuang (57) ABSTRACT

An apparatus includes a printed circuit board having a set of layers and a set of barrels embedded within the set of layers. The apparatus further includes an electrical component having a component body and a set of pins which extends from the component body. The apparatus further includes a set of sleeves. Each sleeve defines a substantially conical shape. The set of sleeves provides electrical and thermal conductivity between the set of pins of the electrical component and the set of barrels of the printed circuit board.

10 Claims, 10 Drawing Sheets

TECHNIQUES FOR PROVIDING ELECTRICAL AND THERMAL CONDUCTIVITY BETWEEN ELECTRICAL COMPONENTS AND PRINTED CIRCUIT BOARDS USING SLEEVES DEFINING SUBSTANTIALLY CONICAL SHAPES

BACKGROUND

There are a variety of conventional techniques for connecting an electronic device having pins to a printed circuit board having corresponding plated through holes (PTHs). Examples of such connecting techniques include wave soldering, intrusive reflow soldering, and compression fit pin schemes.

Unfortunately, each of these conventional connecting techniques makes subsequent removal of the electronic device from the printed circuit board difficult and problematic. For example, it is manually intensive effort to protect both the printed circuit board and the electronic device from damage when reworking a circuit board after assembly. Often the stresses inflicted during device removal (intense local heating to remove solder, high extraction force to pry compression fit pins from their PTHs, etc.) result in damage to the electronic device, the printed circuit board, or both.

Some conventional alternatives to the above-described conventional connecting techniques involve the use of a compliant conductive sleeve having (i) a body with an outwardly bowed (i.e., convex) shape or an inwardly bowed (i.e., concave) shape and (ii) a flanged section which perpendicularly extends from a central axis of the body at one end of the body. During use, the body of the compliant conductive sleeve fits around a device pin and compresses within a PTH. The flanged section lays flat against the flattened top of the PTH to prevent the body from inserting too far into the PTH. An apparatus similar to the above-described conventional compliant conductive sleeve is disclosed in U.S. Pat. No. 7,277,297, the entire teachings of which are hereby incorporated by reference.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Overview

In contrast to the above-described conventional techniques for connecting an electronic device having pins to a printed circuit board, an improved apparatus utilizes a conical shaped sleeve to provide electrical and thermal conductivity between an electrical component pin and a barrel (or PTH) of a printed circuit board. Such a conical shaped sleeve is able to establish robust and reliable contact at low force levels. Additionally, such a sleeve is capable of being manufactured using a simple, low cost process.

One embodiment is directed to an improved apparatus which includes a printed circuit board having a set of circuit board layers and a set of barrels embedded within the set of circuit board layers. The apparatus further includes an electrical component having a component body and a set of pins which extends from the component body. The apparatus further includes a set of sleeves. Each sleeve defines a substantially conical shape. The set of sleeves provides electrical and thermal conductivity between the set of pins of the electrical component and the set of barrels of the printed circuit board.

Another embodiment is directed to a method which involves placing conductive material in contact with a mandrel, shaping the conductive material to mirror an end of the mandrel, cutting the conductive material longitudinally. Such operations form a sleeve which defines a substantially conical shape. The sleeve is arranged to provide electrical and thermal conductivity between a pin of an electrical component and a barrel of a printed circuit board when the sleeve is disposed between the pin of the electrical component and the barrel of the printed circuit board.

DESCRIPTION OF EXAMPLE EMBODIMENTS

Figure 1:
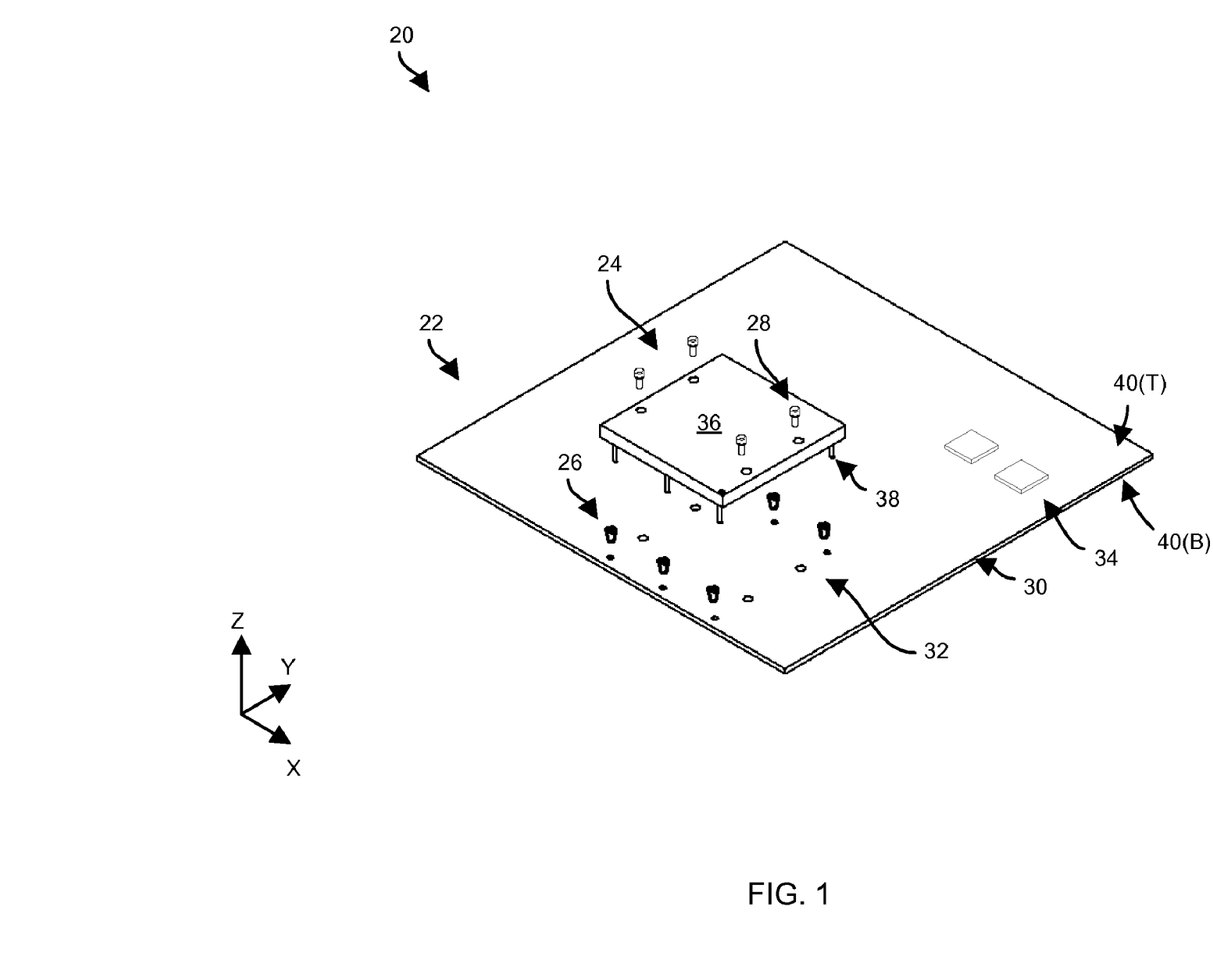
FIG. 1 is an exploded view of an apparatus which utilizes a set of conical shaped sleeves.

FIG. 1 shows an apparatus 20 which includes a printed circuit board 22, an electrical component 24, a set of sleeves 26 (i.e., one or more sleeves 26) and hardware 28. The printed circuit board 22 has a set of circuit board layers 30 (i.e., layers of conductive and non-conductive material sandwiched together) and a set of barrels 32 (e.g., plated through holes or PTHs) embedded within and holding together the layers 30. Collectively, the layers 30 and barrels 32 provide a reliable network of conductors to interconnect a variety of electronic devices 34 (e.g., integrated circuits, discrete components, connectors, etc.).

As shown in FIG. 1, the electrical component 24 has a general component body 36 and a set of pins 38 which extends from the body 36. Devices which are suitable for use as the electrical component 24 include power converters or power bricks, heat sinks, multi-chip modules, large ICs, and other structures of relatively large mass which require mounting to printed circuit boards.

Although an exploded view of the apparatus 20 is shown FIG. 1, it should be clear that the sleeves 26 correspond to the barrels 32 of the printed circuit board 22 and to the pins 38 of the electrical component 24 (e.g., a two-dimensional array or layout). As will be explained in further detail shortly, each sleeve 26 defines a substantially conical (or tapered) shape. During operation, each sleeve 26 is arranged to provide electrical and thermal conductivity between a corresponding barrel 32 and a corresponding pin 36.

The hardware 28 (e.g., bolts/screws, nuts, standoffs, etc.) is arranged to mechanically support the electrical component 24 in a substantially fixed position relative to the printed circuit board 22. In some arrangements, standoffs reside around the general periphery of the electrical component 24 to evenly suspend and hold the component 24 to a fixed distance from the top surface 40(T) of the printed circuit board 22 (the bottom surface being provided with reference numeral 40(B)). As a result, the forces/stresses between the sleeves 26 and the other portions of the apparatus 20 which they physically contact (i.e., the barrels 32 and the pins 38) are able to remain relatively low even though the sleeve 26 nevertheless provides robust and reliable electrical and thermal communication. Further details will now be provided with reference to FIG. 2.

Figure 2:
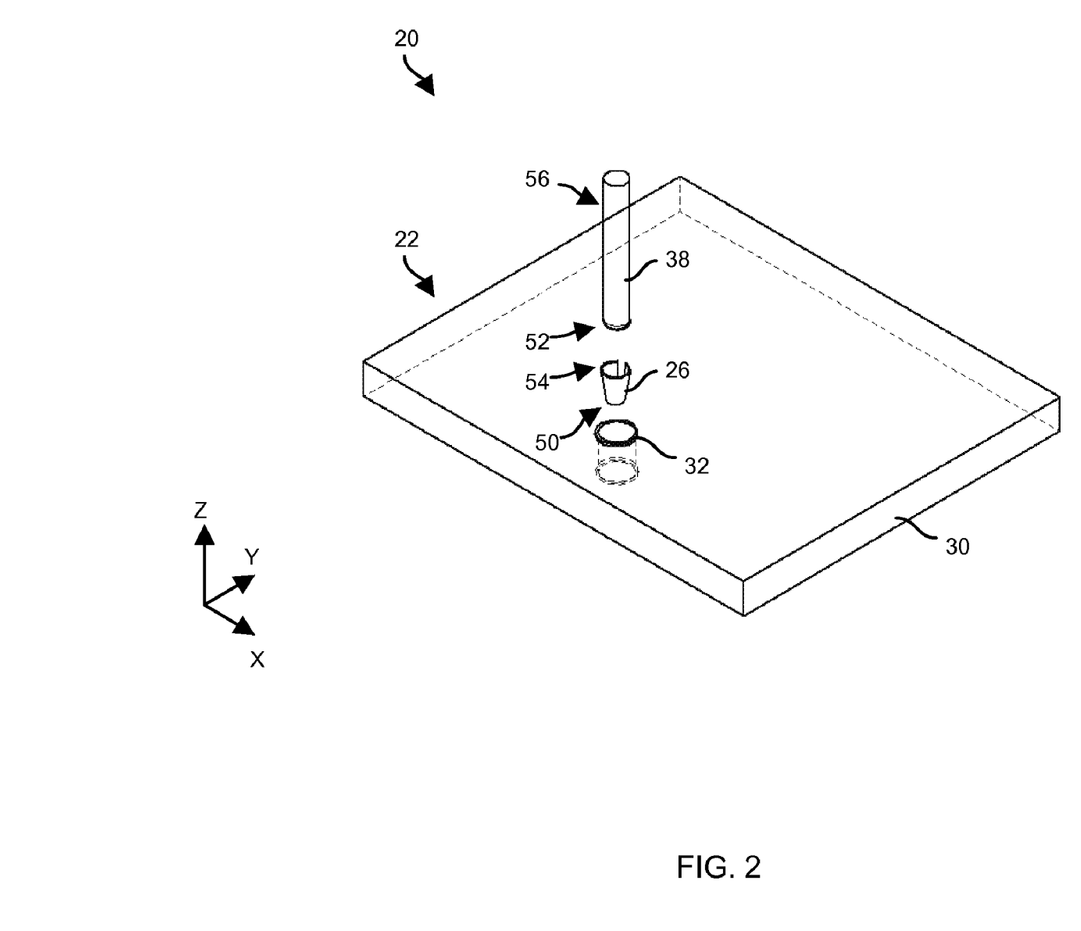
FIG. 2 is a detailed perspective view of an exploded portion of the apparatus of FIG. 1.

FIG. 2 is a detailed view of a portion of the apparatus 20. As shown, there are 1-to-1 correspondences between a sleeve 26, a pin 38, and a barrel 32. In particular, the sleeve 26 is arranged to maintain electrical and thermal conductivity between the pin 38 and the barrel 32 when properly installed, i.e., when the pin 38 is inserted within the barrel 32 through the sleeve 26 in the negative Z-direction.

As further shown in FIG. 2, the narrower end 50 of the sleeve 26 is intended to insert into the barrel 32 of the printed circuit board 22 first. As a result, the narrower end 50 of the sleeve 26 remains proximate to the tip 52 of the pin 38, while the wider end 54 of the sleeve 26 is closer to the trunk portion 56 of the pin 38 which fastens to the body 36 of the electrical device 24 (also see FIG. 1). Further details will now be provided with reference to FIGS. 3 through 5.

Figure 3:
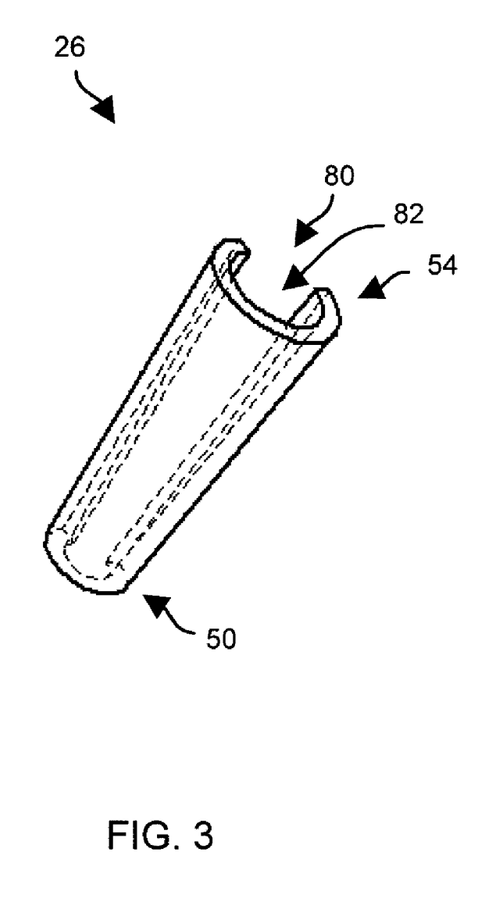
FIG. 3 is a perspective view of a sleeve of FIG. 1.
Figure 4:
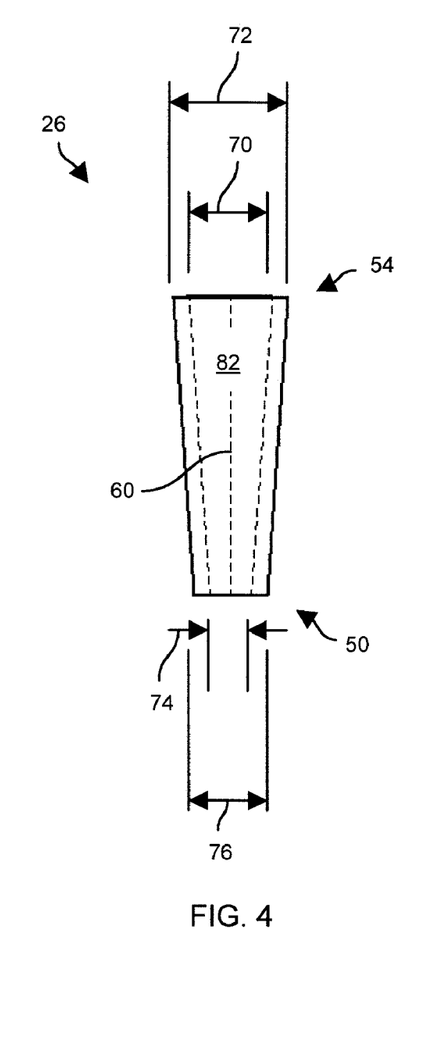
FIG. 4 is a side view of the sleeve of FIG. 3.
Figure 5:
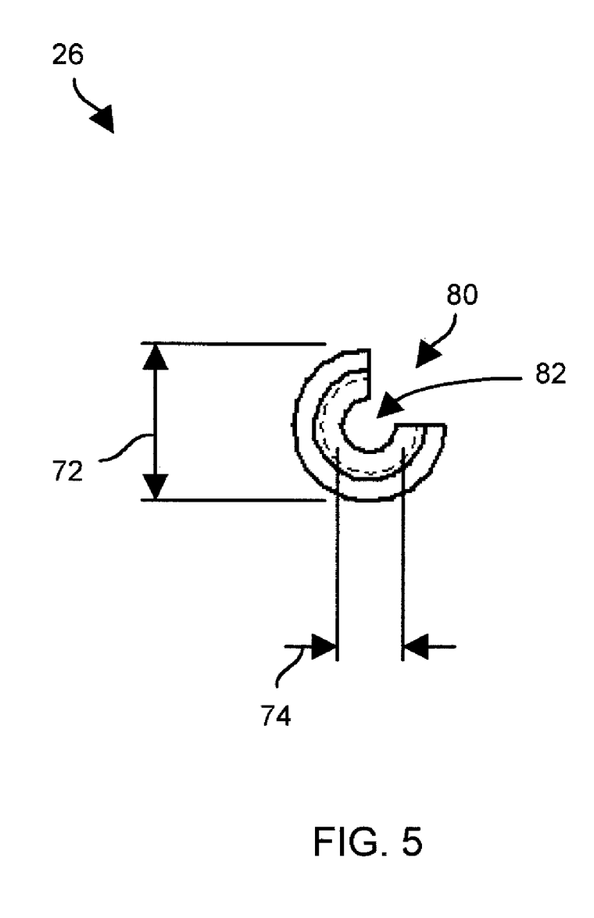
FIG. 5 is a top view of the sleeve of FIG. 3.

FIGS. 3 through 5 provide views of a sleeve 26 from various angles. In particular, FIG. 3 is a perspective view of the sleeve 26. FIG. 4 is a side view of the sleeve 26. FIG. 5 is a top view of the sleeve 26.

The sleeve 26 is elongated in shape and extends along an axis 60 (see FIG. 4). The sleeve 26 tapers continuously in a direction from the wider end 54 to the narrower end 50. Accordingly, the sleeve 26 defines a substantially conical shape, e.g., the sleeve 26 forms a portion of a cone.

As best shown in FIG. 4, the wider end 54 of the sleeve 26 has an inner diameter 70 and an outer diameter 72. Similarly, the narrower end 50 has an inner diameter 74 and an outer diameter 76. The sleeve 26 has a relatively uniform thickness. Accordingly, the inner diameter 70 of the wider end 54 is larger than the inner diameter 74 of the narrower end 50. Likewise, the outer diameter 72 of the wider end 54 is larger than the outer diameter 76 of the narrower end 50.

As best shown in FIGS. 3 and 5, the sleeve 26 further defines a longitudinal slit 80 which extends completely from the wider end 54 to the narrower end 50. As a result, the longitudinal slit 80 exposes an inner cavity 82. In some arrangements, the sleeve 26 extends in an arc approximately 270 degrees (see FIG. 5) for enhanced compliance. As will be explained in further detail shortly, the sleeve 26 is capable of deforming depending on its placement relative to a respective pin 38 and a respective barrel 32. That is, during operation, the circumferences defined by the sleeve 26 are able to contract or expand depending on various forces applied to particular parts of the sleeve 26. Further details will now be provided with reference to FIGS. 6 and 7.

Figure 6:
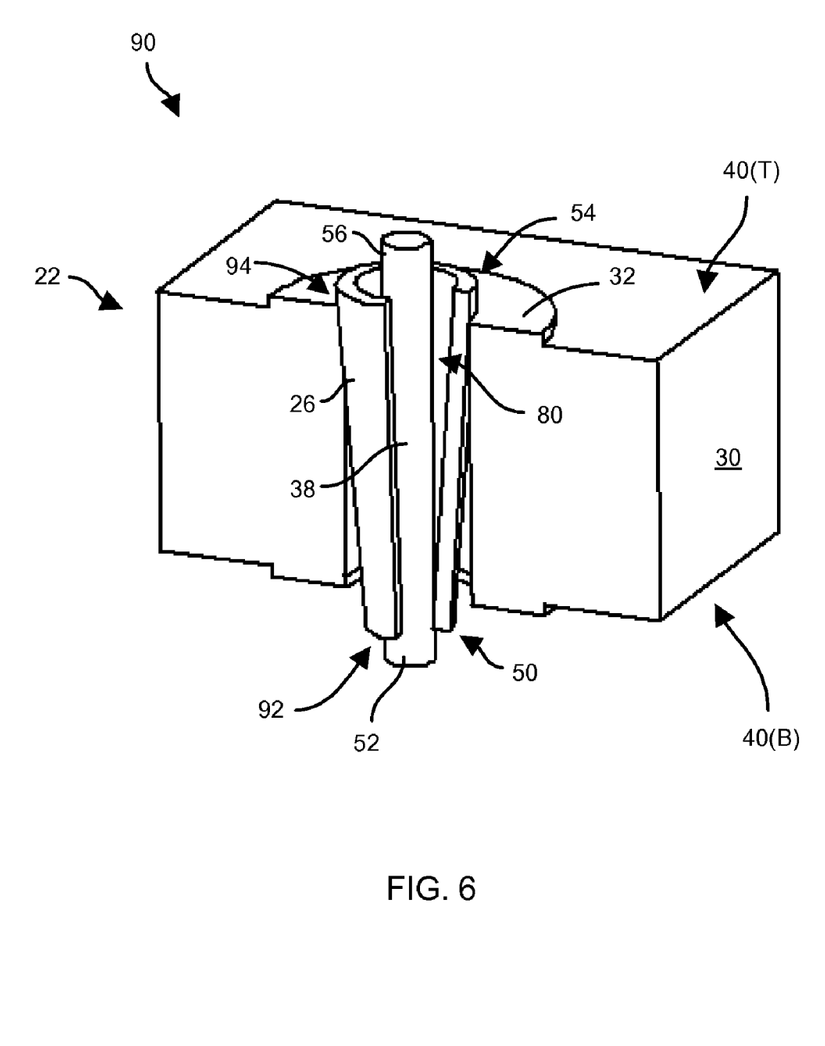
FIG. 6 is a cross-sectional perspective view of an assembled portion of the apparatus of FIG. 1.
Figure 7:
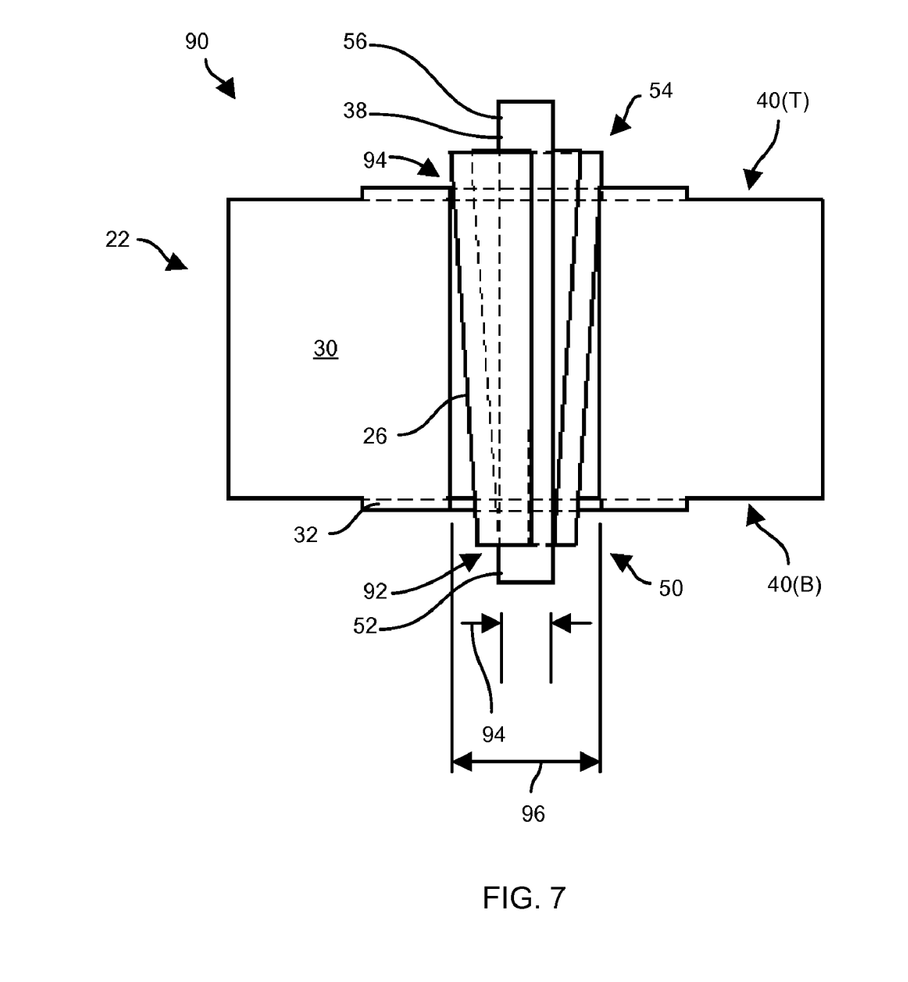
FIG. 7 is a cross-sectional side view of the assembled portion of FIG. 6.

FIGS. 6 and 7 show an assembled portion 90 of the apparatus 20 (also see FIG. 1). FIG. 6 is a cross-sectional perspective view of the assembled portion 90. FIG. 7 is a cross-sectional side view of the assembled portion 90. In some arrangements, the sleeve 26 initially installs around the pin 38, and then the combination of the pin 38 and the sleeve 26 install within the barrel 32. In other arrangements, the sleeve 26 initially installs within the barrel 32 (i.e., the narrow end 50 of the sleeve 26 inserts into the barrel 32 through the top surface 40(T) of the printed circuit board 22), and then the electrical device 24 installs onto the printed circuit board 22 over the top surface 40(T) so that the pin 38 pierces through the narrower pin-contacting end 50 of the sleeve 26.

The inner diameter 74 (FIG. 5) of the narrow, pin-contacting end 50 of the sleeve 26 is set to be slightly smaller than the diameter 92 (FIG. 7) of its respective pin 38. Accordingly, when the sleeve 26 is fit around the pin 38, spring force provided by the sleeve 26 (i.e., an inward force against the pin 38) enables the sleeve 26 to maintain robust and reliable electrical and thermal contact with the pin 38. In some arrangements, the narrow end 50 of the sleeve 26 matches the contour of the pin 38 so well, the sleeve 26 and the pin 38 form a gas tight seal/connection 92 which provides for high electrical conductivity and efficient heat transfer between the pin 38 and the sleeve 26.

Additionally, the outer diameter 72 (FIG. 5) of the wider, barrel-contacting end 54 of the sleeve 26 is set to be slightly larger than the diameter 94 (FIG. 7) of its respective barrel 32. As a result, when the sleeve 26 is fit within the barrel 32, spring force provided by the sleeve 26 (i.e., outward force to counteract compression of the sleeve 26 by the barrel 32) enables the sleeve 26 to maintain robust and reliable electrical and thermal contact with the barrel 32 without over inserting into the barrel 32. In some arrangements, the wider end 54 of the sleeve 26 matches the contour of the barrel 32 so precisely, the sleeve 26 and the barrel 32 form a gas tight seal/connection 94 resulting in high electrical conductivity and efficient heat transfer.

It should be understood that the forces between the sleeve 26 and both the pin 38 and the barrel 32 is relatively low. Nevertheless, the sleeve 26 provides high electrical conductivity and efficient heat transfer between the barrel 32 and the pin 38. Due to the relatively low forces on the barrel 32 and the pin 38, the electrical component 24 can be easily removed. Moreover, the sleeve 26 is relatively low cost and easily replaceable thus providing for a simple and inexpensive rework procedure. Further details will now be provided with reference to FIGS. 8 and 9.

Figure 8:
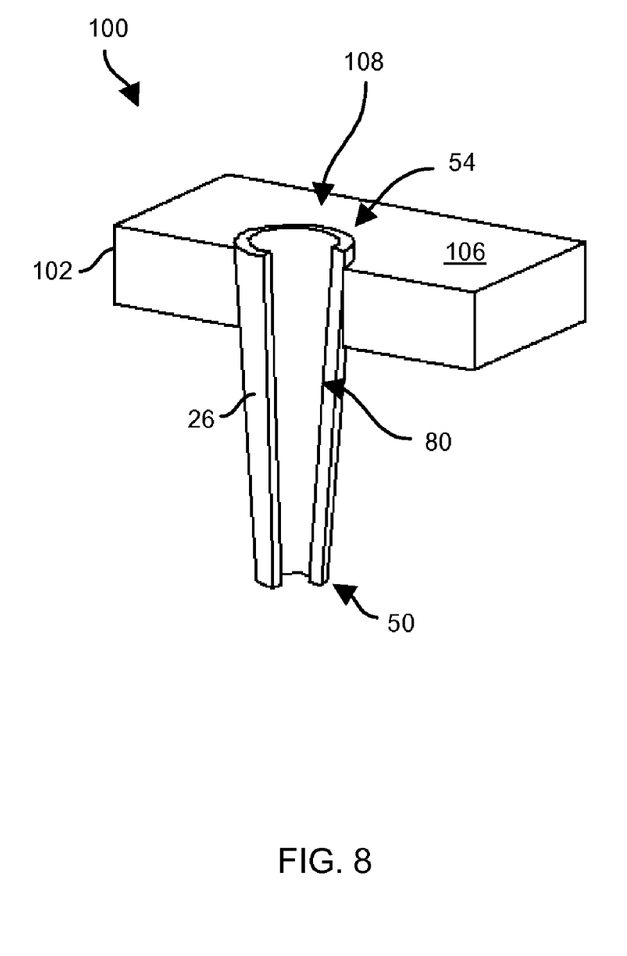
FIG. 8 is a cross-sectional perspective view of a sleeve carrier for use by the apparatus of FIG. 1.
Figure 9:
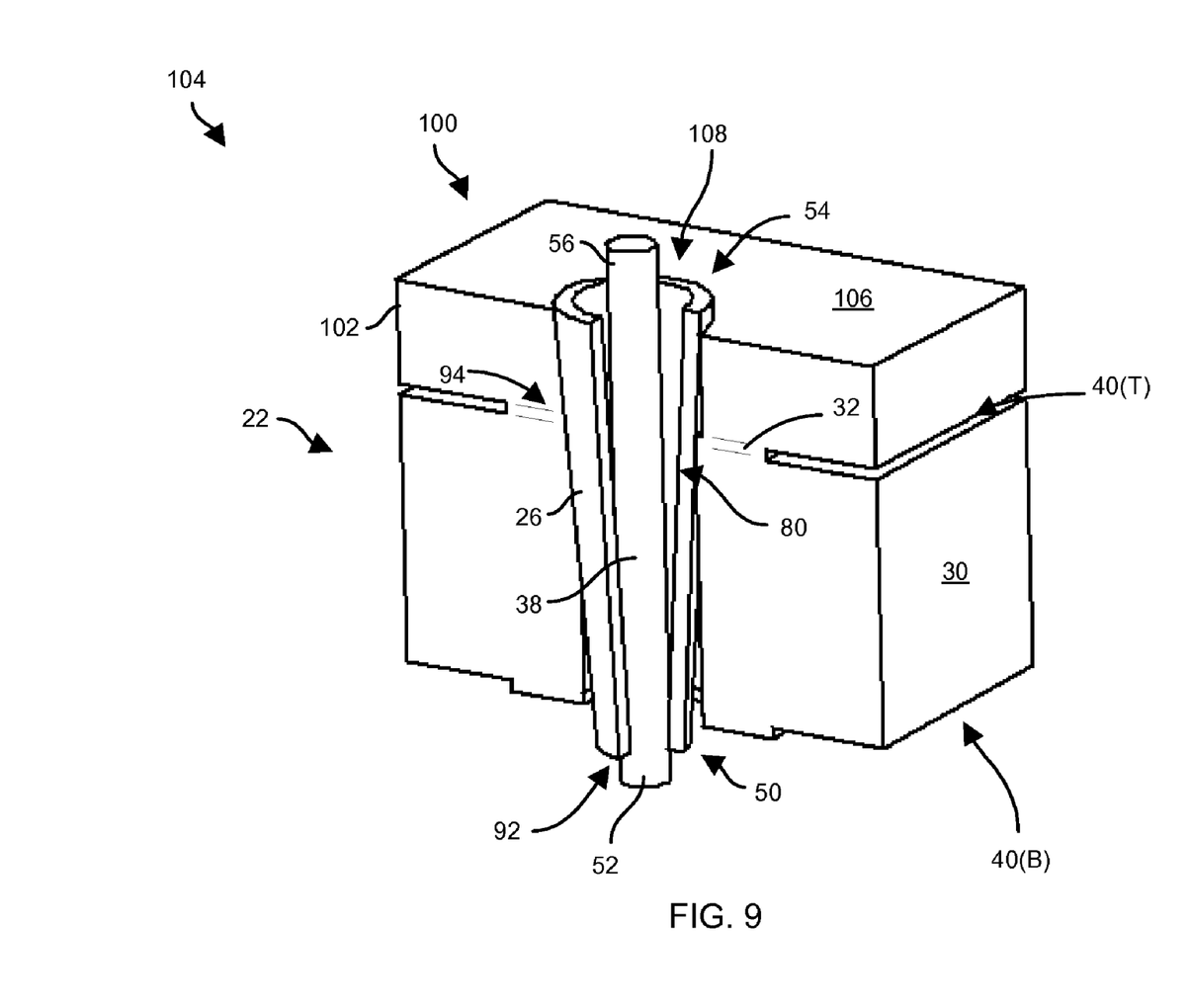
FIG. 9 is a cross-sectional perspective view of the assembled portion of the apparatus of FIG. 1 using the sleeve carrier.

FIGS. 8 and 9 illustrate the use of a sleeve carrier 100 which is arranged to efficiently and effectively manage placement and installation of one or more sleeves 26 (e.g., for pick-and-place style handling of the sleeves 26, for simultaneous installation of multiple sleeves 26, etc.). FIG. 8 is a cross-sectional perspective view of a portion 102 of the sleeve carrier 100 when preloaded with a sleeve 26. FIG. 9 is a cross-sectional perspective view of the portion 102 when installed between the printed circuit board 22 and the electrical component 24 of the apparatus 20 to form an assembled portion 104 of the apparatus 20.

It should be understood that the assembled portion 104 of FIG. 9 is similar to the assembled portion 90 of FIGS. 6 and 7 except that the assembled portion 104 involves the use of the sleeve carrier 100 which is preloaded with the sleeves 26. Along these lines, the sleeve carrier 100 includes a molded housing 106 which defines holes 108 (e.g., see FIG. 8), and a respective sleeve 26 rests within each hole 108. The holes 108 are designed to precisely match the pin layout of the component 24 and the corresponding barrel layout of the printed circuit board 22, e.g., the sleeve carrier 100 positions the sleeves 26 in a two-dimensional array which mirrors the arrays defined by the pins 38 and the barrels 32 (also see FIG. 1).

After the sleeves 26 are installed within the sleeve carrier 100 (FIG. 8), the sleeves 26 join with the pins 38 of the electrical component 24 and the barrels 32 of the printed circuit board 22 (FIG. 9). The end 54 is wider than the carrier 100 and the barrel 32 thus preventing any over insertion. As a result, the sleeve carrier 100 ultimately resides between the electrical component 24 and the printed circuit board 22.

In some arrangements, the sleeve carrier 100 and the electrical component 24 are brought together first so that the sleeves 26 initially install around the pins 38, and then the combination of the pin 38 and the sleeve 26 install within the barrel 32. Next, the electrical component 24 mounts to the printed circuit board 22 so that the narrow ends 50 of the sleeves 26 insert into the barrels 32 through the top surface 40(T) of the printed circuit board 22. Accordingly, the sleeves 26 now electrically and thermally connect the pins 38 and the barrels 32.

In other arrangements, the sleeve carrier 100 and the printed circuit board 22 are brought together first so that the sleeves 26 initially within the barrels 32, i.e., the narrow ends 50 of the sleeves 26 insert into the barrels 32 through the top surface 40(T) of the printed circuit board 22. Next, as the electrical component 24 mounts to the printed circuit board 22, the pins 38 of the electrical component 24 pierce the narrower ends 50 of the sleeves 26. As a result, the sleeves 26 now electrically and thermally connect the pins 38 and the barrels 32.

It should be understood that the forces between the sleeves 26 and both the pins 38 and the barrels 32 are relatively low. However, as described above in connection with FIGS. 6 and 7, the sleeves 26 conform to the contours of the pins 38 and the barrels 32 to provide high electrical conductivity and efficient heat transfer between the barrels 32 and the pins 38. In particular, the sleeves 26 are able to achieve gas-tight coupling 92, 94 between the pins 38 and the barrels 32 (see FIG. 9). Furthermore, the relatively low forces on the barrel 32 and the pin 38, again results in a very simple and inexpensive rework procedure. Such operation is easily and simply achievable since a different mounting mechanism is relied on to provide mechanical support from the printed circuit board 22 to the electrical component 24 (e.g., see the additional hardware 28 in FIG. 1). Further details will now be provided with reference to FIG. 10.

Figure 10:
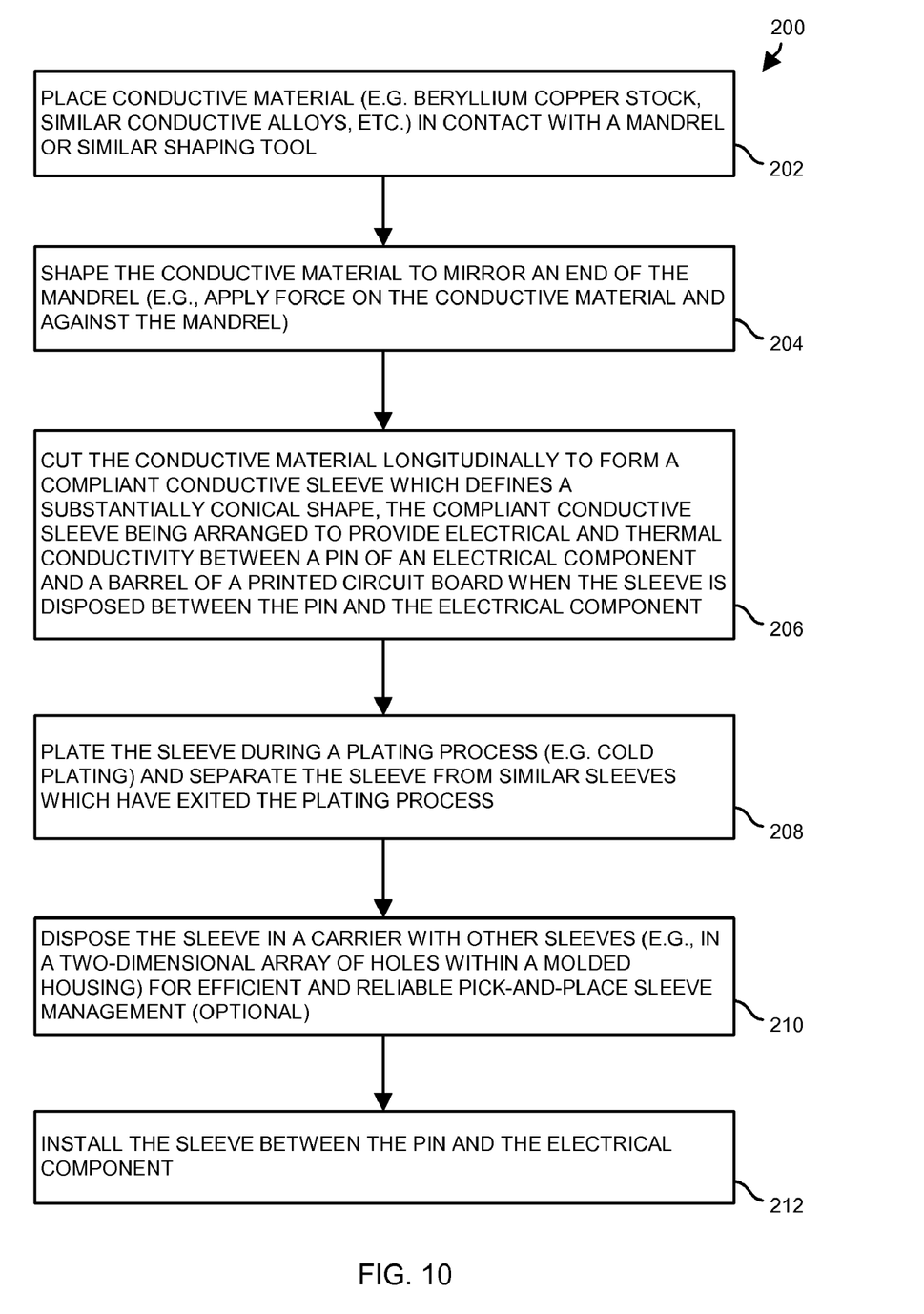
FIG. 10 is a flowchart of a procedure which involves making and using the sleeve of FIG. 3.

FIG. 10 shows a procedure 200 having steps involved in manufacturing and using the sleeves 26. Such a procedure 200 is inexpensive and effective, and can be carried out by a user (e.g., a sleeve manufacturer, an apparatus manufacturer, etc.).

In step 202, the user places conductive material such as beryllium copper stock in contact with a mandrel or other shaping tool. In step 204, the user shapes the conductive material to mirror an end or feature of the mandrel, e.g., apply force on the conductive material and the mandrel to provide a taper to a piece of the conductive material. Preferably, the thickness of the conductive material remains substantially uniform. In step 206, the user cuts the conductive material longitudinally to form a sleeve 26 (also see FIGS. 3 through 5) which defines a substantially conical shape. The sleeve 26 is now arranged to provide electrical and thermal conductivity between a pin 38 of an electrical component 24 and a barrel 32 of a printed circuit board 22 when the sleeve 26 is disposed between the pin 38 and the barrel 32.

In step 208, the user plates the sleeve 26 during a plating process (e.g., gold plating), and separates the sleeve 26 from similar sleeves 26 which have exited that plating process. At this point, the sleeves 26 are completely formed as shown in FIGS. 3 through 5.

In step 210, the user is able to perform an optional step of disposing the sleeve 26 in a carrier 100 with other sleeves 26. In some arrangements, the user places individual sleeves 26 in a two-dimensional array of holes 108 within a molded housing 106 (FIG. 8) in order to preload the carrier 100.

In step 212, the user installs the sleeve 26 within an apparatus 20. In particular, the user disposes the sleeve 26 between a pin 38 of an electrical component 24 and a barrel 32 of a printed circuit board 22. FIGS. 6 and 7 show the sleeve 26 installed within a portion 90 of the apparatus 20 without the use of the carrier 100. FIG. 9 shows the sleeve 26 installed within a portion 104 of the apparatus 20 using the carrier 100.

As described above, an improved apparatus 20 utilizes a conical shaped sleeve 26 to provide electrical and thermal conductivity between an electrical component pin 38 and a barrel 32 (e.g., a plated through hole of a printed circuit board 22). Such a conical shaped sleeve 26 is able to establish robust and reliable contact at low force levels. Additionally, such a sleeve 26 is able to be manufactured using a simple, low cost process.

While various embodiments of the invention have been particularly shown and described, it will be understood by those skilled in the art that various changes in form and details may be made therein without departing from the spirit and scope of the invention as defined by the appended claims.

For example, it should be understood that different sized sleeves 26 can be fabricated to accommodate different standard barrel and pin sizes. The particular geometry and composition of the sleeves 26 result in robust and reliable spring like action for compliancy and versatility over a wide temperature range.

What is claimed is:

1. A device, comprising:
a sleeve defining a substantially conical shape, the sleeve being arranged to provide electrical and thermal conductivity between a pin of an electrical component and a barrel of a printed circuit board when the sleeve is disposed between the pin of the electrical component and the barrel of the printed circuit board, the sleeve including a pin contacting end having a first outer diameter, and a barrel-contacting end having a second outer diameter, the sleeve tapering continuously in a same direction from the barrel-contacting end to the pin-contacting end wherein the first outer diameter is narrower than the second outer diameter, the sleeve further including a slit extending longitudinally thereon from the barrel-contacting end to the pin-contacting end.

2. A device as in claim 1 wherein the pin-contacting end further includes a first inner diameter, and the barrel-contacting end further includes a second inner diameter, the first inner diameter being narrower than the second inner diameter.

3. An apparatus, comprising:
a printed circuit board having a set of layers and a set of barrels embedded within the set of layers;
an electrical component having a component body and a set of pins which extends from the component body; and
a set of sleeves, each sleeve having a pin contacting end having a first inner diameter and a first outer diameter, and a barrel-contacting end having a second inner diameter and a second outer diameter, each sleeve defining a substantially conical shape that tapers continuously in a same direction from the barrel-contacting end to the pin-contacting end defined by that sleeve wherein the first inner diameter is narrower than the second inner diameter and the first outer diameter is narrower than the second outer diameter, each sleeve further including a slit extending longitudinally thereon from the barrel-contacting end to the pin-contacting end, and wherein the set of sleeves provides electrical and thermal conductivity between the set of pins of the electrical component and the set of barrels of the printed circuit board during use.

4. An apparatus as in claim 3 wherein the printed circuit board defines a component side which faces the electrical component and an opposite side which faces away from the electrical component; and wherein at least a portion of each sleeve is arranged to extend above a plane defined by the component side of the printed circuit board when that sleeve provides electrical and thermal conductivity between a pin of the set of pins and a barrel of the set of barrels.

5. An apparatus as in claim 3, further comprising:

hardware arranged to mechanically support the electrical component in a substantially fixed position relative to the printed circuit board.

6. An apparatus as in claim 3 wherein, for each sleeve, the pin-contacting end defined by that sleeve is proximate to a pin tip, and the barrel-contacting end defined by that sleeve is proximate to a pin base.

7. An apparatus as in claim 6 wherein each barrel of the set of barrels has an inner barrel diameter which is (i) greater than the first outer diameter and (ii) narrower than the second outer diameter.

8. An apparatus as in claim 6 wherein, for each sleeve, the pin-contacting end is arranged to form a gas tight connection between that sleeve and a pin of the set of pins, and the barrel-contacting end is arranged to form a gas tight connection between that sleeve and a barrel of the set of barrels.

9. An apparatus as in claim 3, further comprising:

a sleeve carrier disposed between the electrical component and the printed circuit board.

10. An apparatus as in claim 9 wherein the sleeve carrier includes a molded housing arranged to position each sleeve of the set of sleeves in an array which mirrors an array defined by the set of pins and the set of barrels.

\* \* \* \* \*